(12) United States Patent
Shida et al.

(10) Patent No.: US 11,670,272 B2
(45) Date of Patent: Jun. 6, 2023

(54) AMPLIFIER FOR MUSIC SIGNAL AND METHOD OF OUTPUTTING WAVEFORM OF MUSIC SIGNAL

(71) Applicant: Roland Corporation, Shizuoka (JP)

(72) Inventors: Mitsuo Shida, Shizuoka (JP); Yoshinobu Morimoto, Shizuoka (JP); Kosuke Takada, Shizuoka (JP)

(73) Assignee: Roland Corporation, Shizuoka (JP)

( * ) Notice: Subject to any disclaimer, the term of this patent is extended or adjusted under 35 U.S.C. 154(b) by 241 days.

(21) Appl. No.: 17/129,936

(22) Filed: Dec. 22, 2020

(65) Prior Publication Data

US 2021/0201879 A1 Jul. 1, 2021

(30) Foreign Application Priority Data

Dec. 27, 2019 (JP) .............................. JP2019-239930

(51) Int. Cl.
*G10H 3/18* (2006.01)
*G10H 1/00* (2006.01)
*H03F 1/32* (2006.01)

(52) U.S. Cl.
CPC ............ *G10H 3/187* (2013.01); *G10H 1/0091* (2013.01); *H03F 1/327* (2013.01)

(58) Field of Classification Search
CPC ......... G10H 3/87; G10H 1/0091; H03F 1/327
USPC .......................................................... 381/61
See application file for complete search history.

(56) References Cited

U.S. PATENT DOCUMENTS

| 3,648,188 | A * | 3/1972 | Ratcliff | H03F 3/245 330/196 |
| 4,936,185 | A * | 6/1990 | Yamaguchi | G10H 1/32 84/670 |
| 6,344,982 | B1 * | 2/2002 | Morimoto | H04N 3/185 363/21.04 |
| 8,428,271 | B1 * | 4/2013 | Luke | H03G 7/08 381/61 |
| 10,158,327 | B2 * | 12/2018 | Kim | H04B 1/0028 |
| 2004/0021512 | A1 * | 2/2004 | Tanaka | H03F 3/2171 330/10 |
| 2004/0061552 | A1 * | 4/2004 | Tanaka | H03F 3/185 330/10 |
| 2004/0116162 | A1 * | 6/2004 | Matsushima | H03G 3/004 455/574 |

(Continued)

FOREIGN PATENT DOCUMENTS

| JP | S5951167 | | 12/1984 |
| JP | H1155041 | A * | 2/1999 |
| JP | 3336089 | | 10/2002 |

OTHER PUBLICATIONS

"Search Report of Europe Counterpart Application", dated May 27, 2021, p. 1-p. 12.

*Primary Examiner* — Christina M Schreiber
(74) *Attorney, Agent, or Firm* — JCIPRNET

(57) ABSTRACT

An amplifier and a method of outputting a waveform of a music signal capable of outputting a waveform of a music signal exceeding a power supply voltage is provided. An amplifier includes a power supply, an input terminal for a music signal, an amplifying circuit which amplifies the music signal using the power supply, and a jumping-up circuit which is connected to an output end of the amplifying circuit and outputs a waveform exceeding a voltage value of the power supply.

5 Claims, 10 Drawing Sheets

(56) References Cited

U.S. PATENT DOCUMENTS

| | | | |
|---|---|---|---|
| 2011/0074379 A1* | 3/2011 | Morimoto | H02M 1/10 |
| | | | 307/66 |
| 2018/0233950 A1* | 8/2018 | Cimaz | H04R 3/00 |
| 2020/0127561 A1* | 4/2020 | Takada | H02M 3/156 |
| 2020/0279546 A1* | 9/2020 | Chase | G10H 1/125 |
| 2021/0201879 A1* | 7/2021 | Shida | G10H 1/0091 |

\* cited by examiner

Input and output waveform of amplifying circuit of vacuum tube amplifier (actual measurement)

Input and output waveform of jumping-up circuit (simulation)

AMPLIFIER FOR MUSIC SIGNAL AND METHOD OF OUTPUTTING WAVEFORM OF MUSIC SIGNAL

CROSS-REFERENCE TO RELATED APPLICATION

This application claims the priority benefits of Japan Patent Application No. 2019-239930, filed on Dec. 27, 2019. The entirety of the above-mentioned patent application is hereby incorporated by reference herein and made a part of this specification.

BACKGROUND

Technical Field

The present disclosure relates to an amplifier for a music signal and a method of outputting a waveform of a music signal.

Description of Related Art

Conventionally, it has become known that a circuit simulating the electrical characteristics of a vacuum tube can be applied to a guitar amplifier, and a technique for simulating the input and output characteristics characteristic to a vacuum tube amplifier is known (see, for example, Patent Document 1). In addition, an invention simulating the distortion impression characteristic to a vacuum tube amplifier by adjusting a filter multiplier according to the level of a guitar input signal has been proposed (see, for example, Patent Document 2).

PATENT DOCUMENTS

[Patent Document 1] Japanese Examined Patent Application, Second Publication No. S59-051167
[Patent Document 2] Japanese Patent No. 3336089

SUMMARY

In the related art, even when the shape of a waveform of a vacuum tube amplifier can be simulated, a waveform exceeding a power supply voltage cannot be output.

The disclosure provides an amplifier capable of outputting a waveform of a music signal exceeding a power supply voltage.

According to an embodiment, there is provided an amplifier comprising a power supply, an input terminal for a music signal, an amplifying circuit which amplifies the music signal using the power supply, and a circuit which is connected to an output end of the amplifying circuit and outputs a waveform exceeding a voltage value of the power supply. The circuit is, for example, a jumping-up circuit.

For the amplifier, a configuration in which an output end of the jumping-up circuit is connected to a speaker load in series may be adopted. In addition, for the circuit in the amplifier, a configuration including a jumping-up control circuit that controls an output waveform of the circuit may be adopted.

In addition, a configuration in which the jumping-up circuit in the amplifier is a resonance circuit including an inductive load and a capacitive load may be adopted. In addition, a configuration in which the jumping-up circuit is a resonance circuit including an inductive load, a first capacitive load, and a rectifying element connected between the inductive load and the capacitive load may be adopted. In addition, a configuration in which the jumping-up circuit is a resonance circuit including an inductive load, a first capacitive load, a second capacitive load including a damping element, and a rectifying element connected between the inductive load and the first capacitive load may be adopted.

DESCRIPTION OF THE EMBODIMENTS

Figure 1:
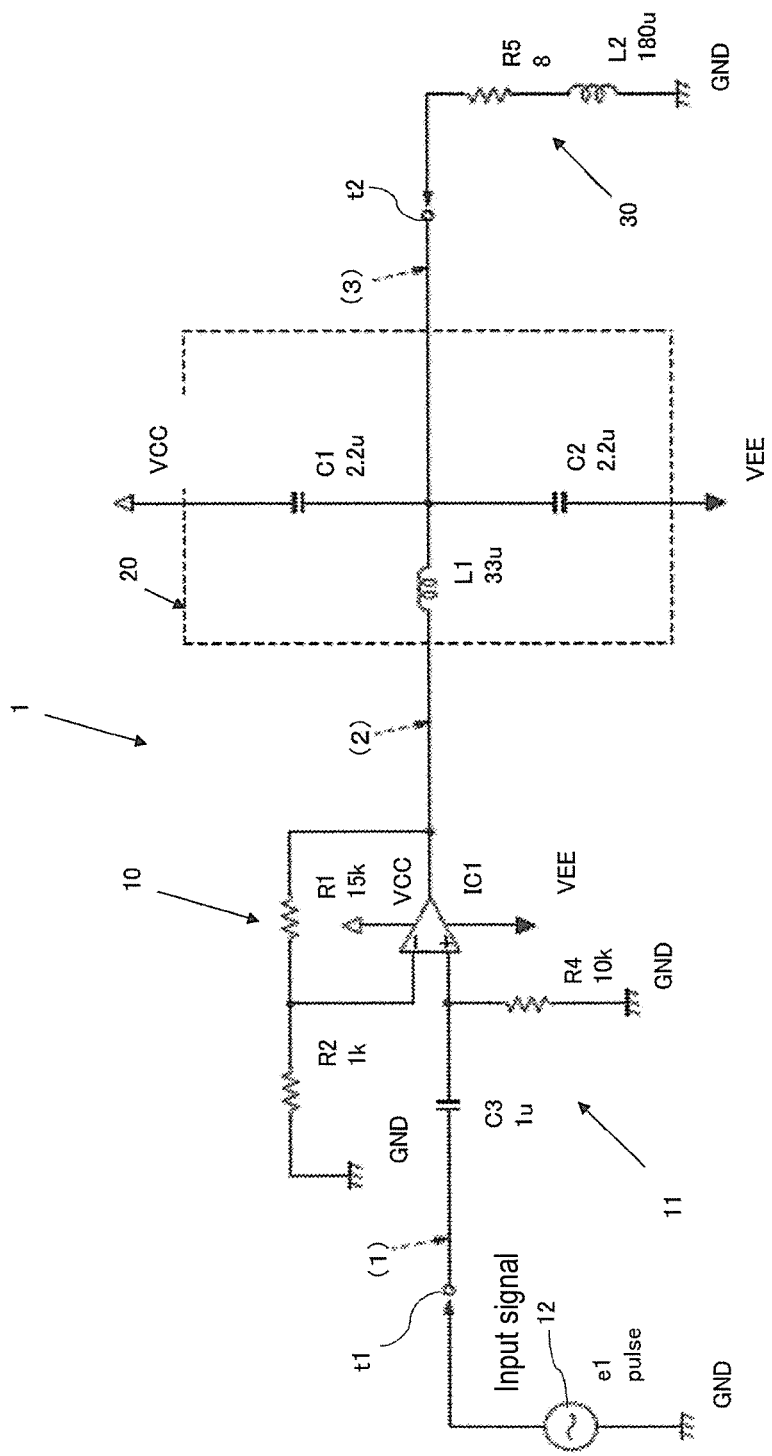
FIG. 1 illustrates a circuit configuration of an amplifier (power amplifier) which is applicable to a guitar amplifier.
Figure 2:
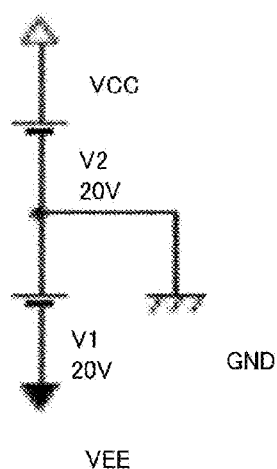
FIG. 2 illustrates power supply voltages of the amplifier.

Hereinafter, an embodiment of an amplifying circuit will be described with reference to the drawings. A configuration of the embodiment is an example, and the disclosure is not limited thereto. FIG. 1 illustrates a circuit configuration of an amplifier 1 (amplifying circuit: power amplifier) which is applicable to a guitar amplifier. The amplifier 1 is configured such that a waveform obtained by simulating a vacuum tube amplifier is obtained. FIG. 2 illustrates power supply voltages VCC and VEE.

In FIG. 1, an operational amplifier IC1, a resistor R1, and a resistor R2 are amplifying circuits 10 for an input signal e1 which is input from an input terminal t1. An oscillator 12 that outputs the input signal e1 which is a pulse having a predetermined frequency is connected to the input terminal t1. The input signal is a music signal obtained during a musical performance of an electric guitar connected to a guitar amplifier. Meanwhile, the amplifying circuit 10 illustrated in FIG. 1 is a non-inversion amplifying circuit, but an inversion amplifying circuit may be applied. A capacitor C1 is coupled between the positive input terminal of the operational amplifier IC1 and the input terminal t1, and the resistor R4 is coupled between the positive input terminal of the operational amplifier IC1 and the ground GND.

A speaker load 30 is connected to an output terminal t2 of the amplifier. The speaker load 30 includes a resistor R5 which is a pure resistance component of a speaker unit and a parasitic induction component L2. For the speaker unit, a speaker unit adopted for a general guitar amplifier is assumed.

Figure 3:
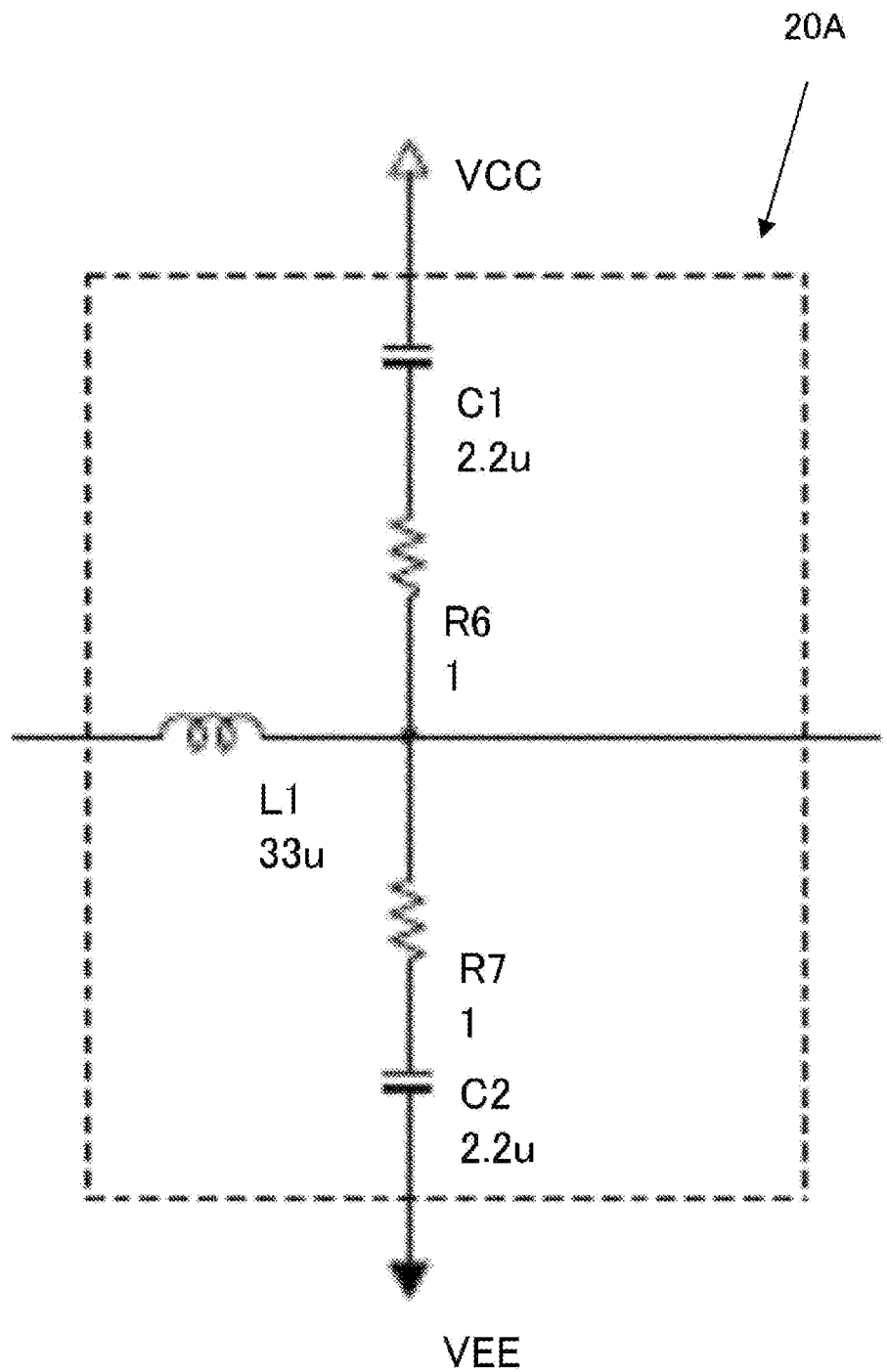
FIG. 3 illustrates a configuration example of a jumping-up circuit.
Figure 4:
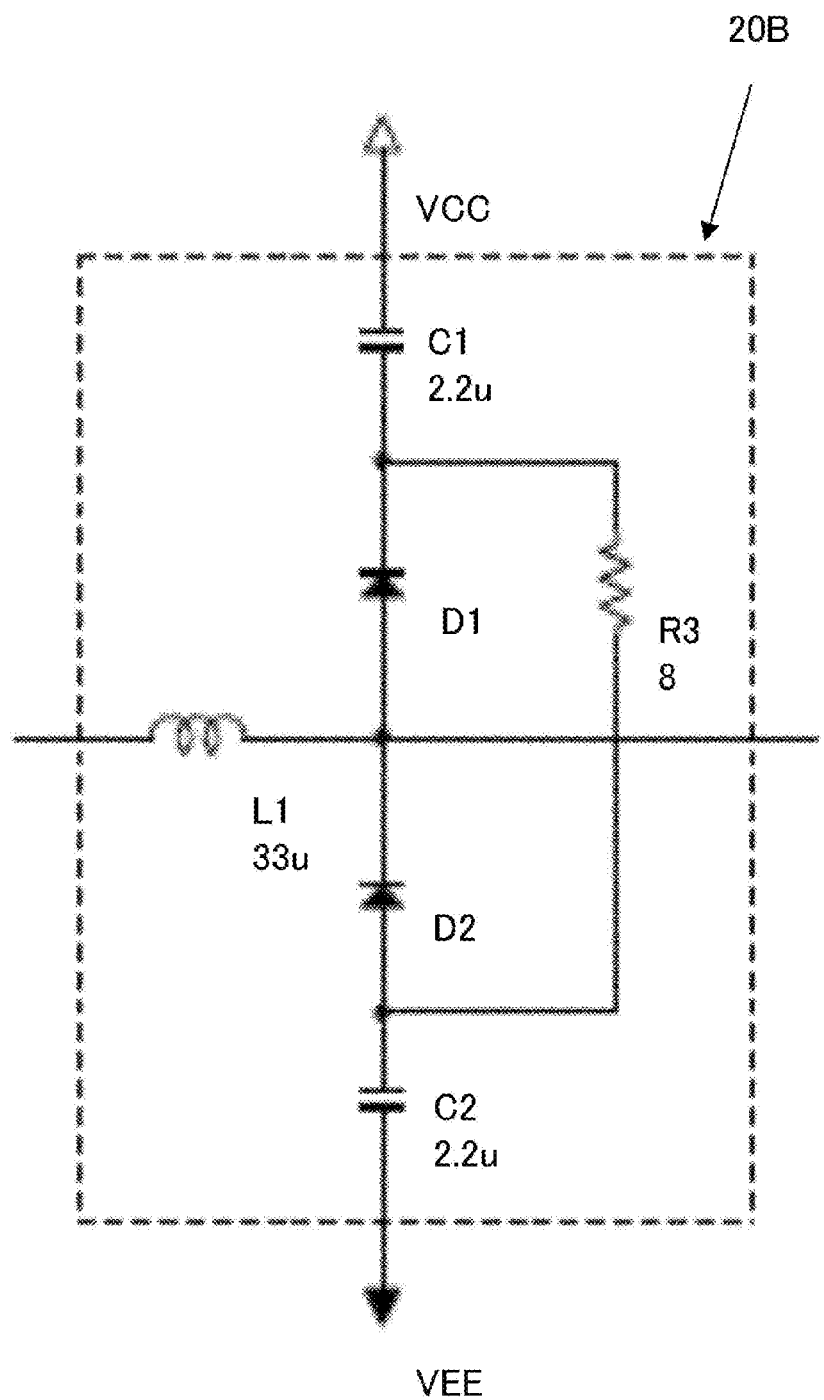
FIG. 4 illustrates a configuration example of a jumping-up circuit.

A jumping-up circuit 20 (first jumping-up circuit) is inserted between the amplifying circuit 10 and the output terminal t2. That is, a signal from the amplifying circuit 10 passes through the jumping-up circuit 20 and is then connected to the speaker load 30. The jumping-up circuit 20 is a resonance circuit including a coil L1 which is a inductive load and capacitors C1 and C2 which are capacitive loads, in the example illustrated in FIG. 1. However, as illustrated in FIG. 3, a jumping-up circuit 20A (second jumping-up circuit) which is a resonance circuit having damping resistors R6 and R7 added thereto may be adopted. Alternatively, as illustrated in FIG. 4, a configuration of a jumping-up circuit 20B (third jumping-up circuit) having diodes D1 and D2 which are rectifying elements and a resistor R3 added thereto may be adopted.

Figure 5:
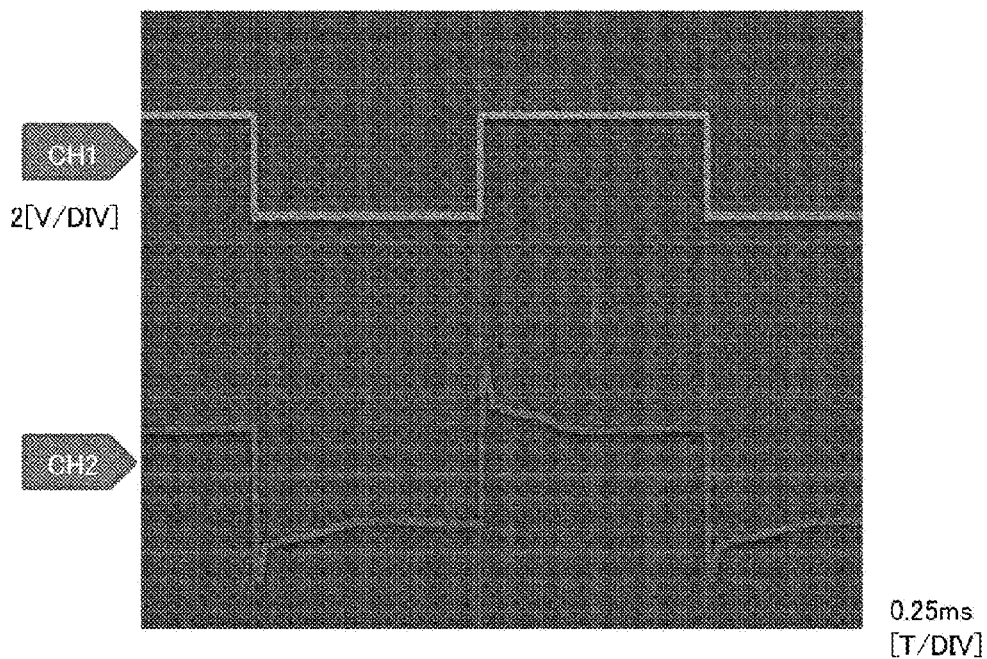
FIG. 5 illustrates an example of an input and output waveform of a vacuum tube amplifier.

FIG. 5 illustrates an output waveform (a lower part of FIG. 4) output to a speaker load observed in a case where a rectangular wave (an upper part of FIG. 4) having a period of 1 kHz is input to a vacuum tube amplifier. According to the vacuum tube amplifier, a so-called jumping-up waveform output having the following characteristics is observed.

(1) A waveform jumps up particularly greatly (an overshoot occurs) during rising and falling of the waveform.

(2) A peak voltage value (peak value) of jumping-up is a value larger than a power supply voltage.

As an input signal (e1) for the amplifier illustrated in FIG. 1, a rectangular wave having a period of 1 kHz based on a positive-side waveform and a negative-side waveform is adopted. This is a waveform suitable for observing characteristics of a so-called attack waveform immediately after picking a guitar, among assumed output musical sound waveforms of the electric guitar.

Figure 6:
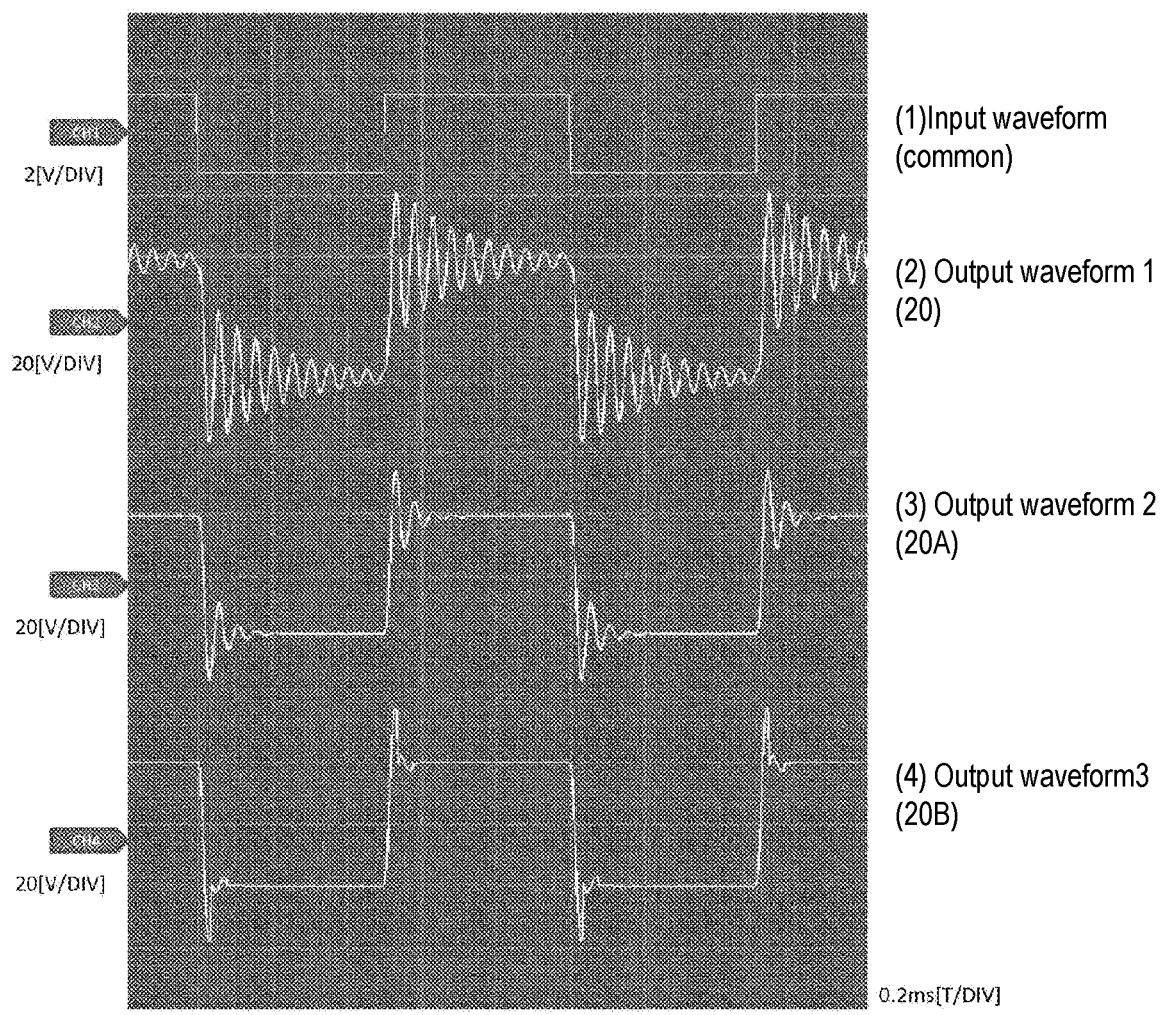
FIG. 6 illustrates an input waveform for a jumping-up circuit and output waveforms of first to third jumping-up circuits.

FIG. 6 illustrates input and output waveforms of the jumping-up circuits 20, 20A, and 20B. An uppermost part in FIG. 6 shows a waveform at an observation point (2) in FIG. 1, that is, an input waveform for the jumping-up circuit. A second part from the top in FIG. 6 and FIG. 7 shows a waveform at an observation point (3) in FIG. 1, that is, an output waveform of the jumping-up circuit 20 in a case where the jumping-up circuit 20 is adopted.

With respect to an input waveform, an output waveform of the jumping-up circuit generates a resonance wave (ringing) having a plurality of peaks during rising and falling of the waveform. A peak value of a first peak including resonance exceeds a power supply voltage (±40 V), and a so-called jumping-up effect is generated. This is because resonance occurs due to L1 and (C1+C2) during rising and falling of a waveform.

Figure 7:
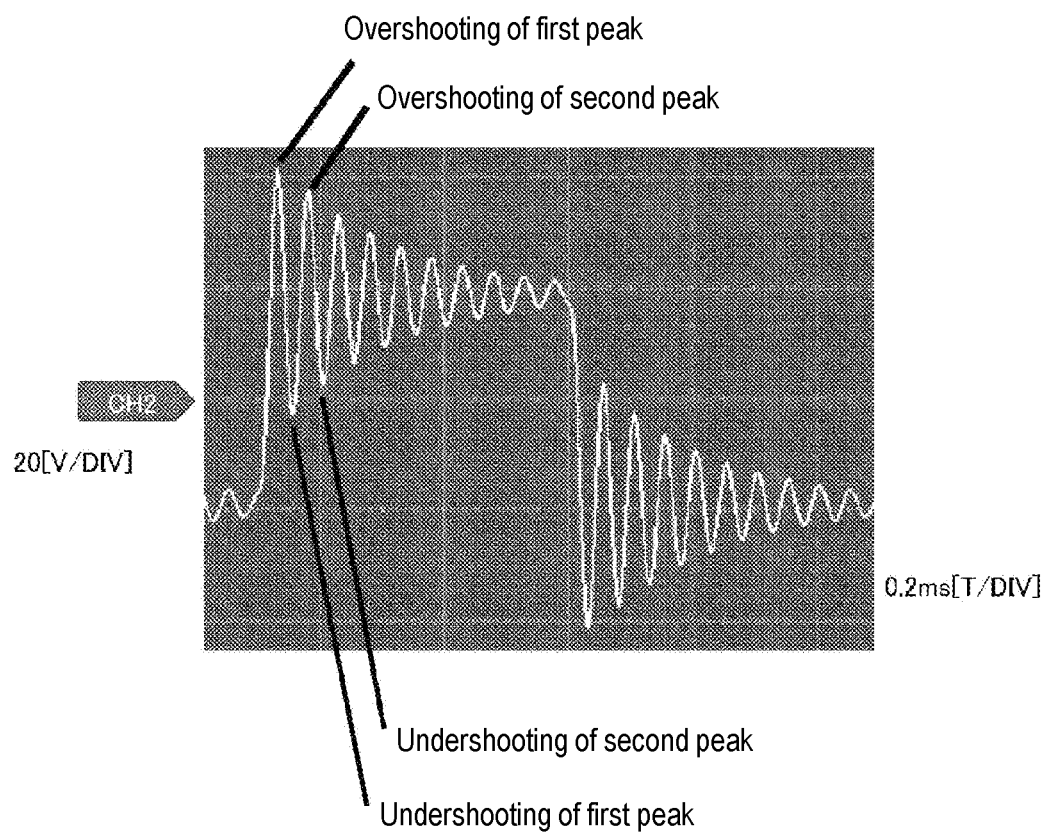
FIG. 7 illustrates the output waveform of the first jumping-up circuit.

However, as illustrated in FIG. 7, undershooting of the first peak and a peak after the subsequent second peak occurs subsequently to overshooting of the first peak, which results in an attenuation state while oscillating. In this manner, a waveform which jumps up (jumps down) particularly greatly during rising and falling of a waveform which is a feature of a waveform of a vacuum tube amplifier, as illustrated in FIG. 5, is not obtained.

An output waveform shown in a third part from the top in FIG. 6 shows an output waveform of the jumping-up circuit 20A (a waveform at an observation point (3) in FIG. 1) with respect to an input waveform shown in an uppermost part. As compared with an output waveform of the jumping-up circuit 20 (a second part from the top in FIG. 6), resonance of the coil L1 and the capacitor C1 and resonance of the coil L1 and the capacitor C2 are suppressed by the application of a damping effect obtained by the resistors R6 and R7.

However, in the output waveform of the jumping-up circuit 20A, peaks after the second peak is occurred (ringing occurred) following the overshooting of the first peak and the undershooting of the first peak, and thus a waveform in which one overshooting or undershooting occurs as in an output waveform of a vacuum tube amplifier (FIG. 5) is not obtained.

Figure 8:
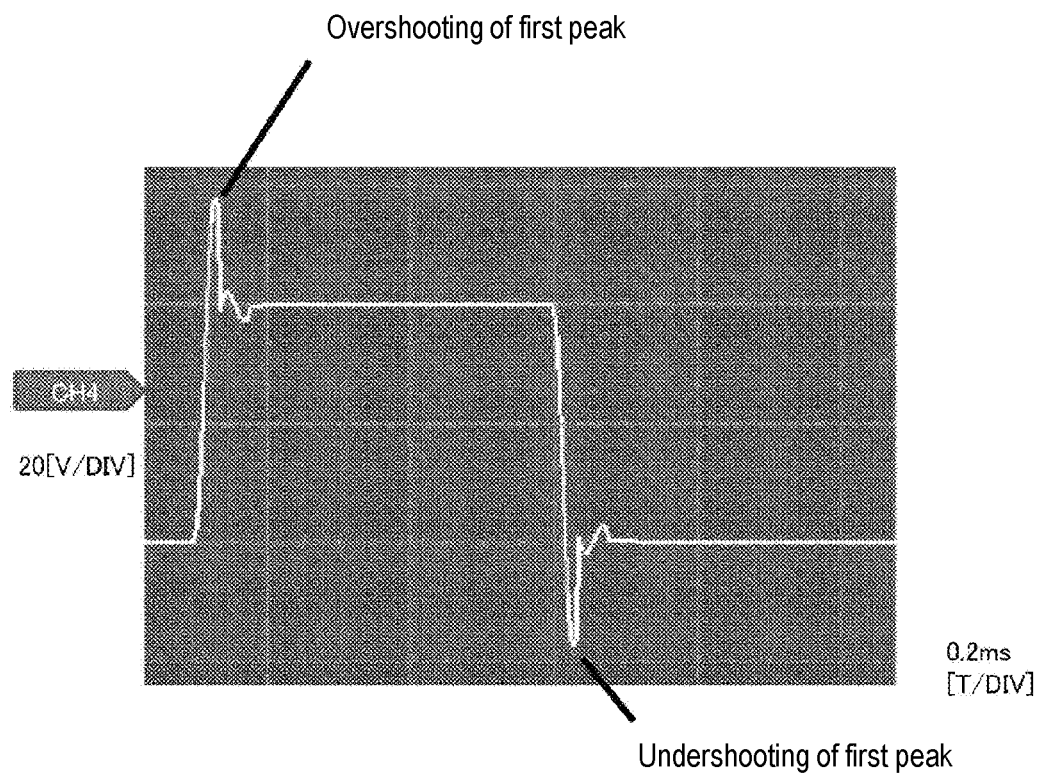
FIG. 8 illustrates the output waveform of the third jumping-up circuit.

An output waveform shown in a fourth part (a lowermost part) from the top in FIG. 6 and FIG. 8 shows an output waveform of the jumping-up circuit 20B (the waveform at the observation point (3) in FIG. 1) with respect to the input waveform in the uppermost part. In the output waveform of the jumping-up circuit 20B, a resonance wave (overshooting and undershooting) having a first peak is generated during rising and falling corresponding to rising and falling of an input pulse. A peak value of the first peak including resonance exceeds a power supply voltage (±40 V), which leads to a so-called jumping-up effect.

In addition, as compared with the jumping-up circuit 20 and 20A, hardly any swing width after the overshooting and undershooting of the first peak is generated in the jumping-up circuit 20B, and thus it can be said that ringing does not occur. That is, a waveform close to an output waveform of a vacuum tube amplifier is obtained.

Figure 9:
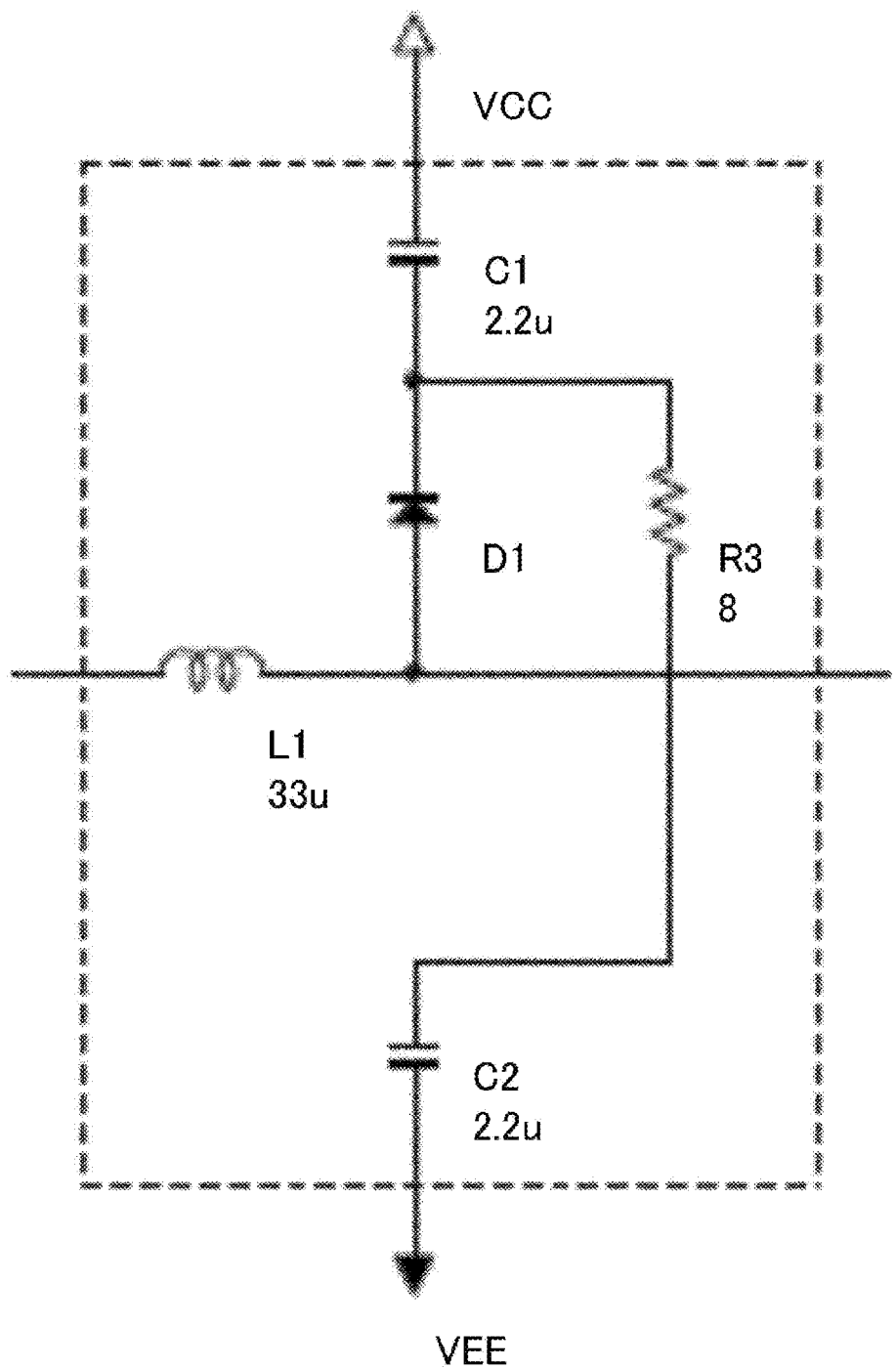
FIG. 9 illustrates an equivalent circuit in a case where a positive-side input signal is input to the third jumping-up circuit.

FIG. 9 illustrates an equivalent circuit of the jumping-up circuit 20B in a case where a positive-side input waveform is input to the jumping-up circuit 20B. The equivalent circuit includes a capacitor C1 which is a first capacitive load, a capacitor C2 which is a second capacitive load including a resistor R3 which is a damping element, and a diode D1 which is a rectifying element connected between the capacitor C1 and a coil L1 which is an inductive load. When an operation of the jumping-up circuit 20B is described using the equivalent circuit, overshooting of a first peak illustrated in FIG. 8 occurs due to resonance between the coil L1 and the capacitors C1 and C2. In this case, resonance between the capacitor C1 and the coil L1 which does not pass through the damping resistor R3 has a dominant effect. In the meantime, the capacitor C2 is charged with a delay charge through the damping resistor R3.

After the overshooting of the first peak, the resonance between the coil L1 and the capacitor C1 induces undershooting of the first peak and the second and subsequent peaks. However, the capacitor C2 is charged with a delay charge, and thus the occurrence of undershooting of the first peak and peaks after the second peak and the subsequent induced due to the resonance of the coil L1 and the capacitor C1 is suppressed by an integration circuit constituted by the resistor R3 and the capacitor C2.

Figure 10:
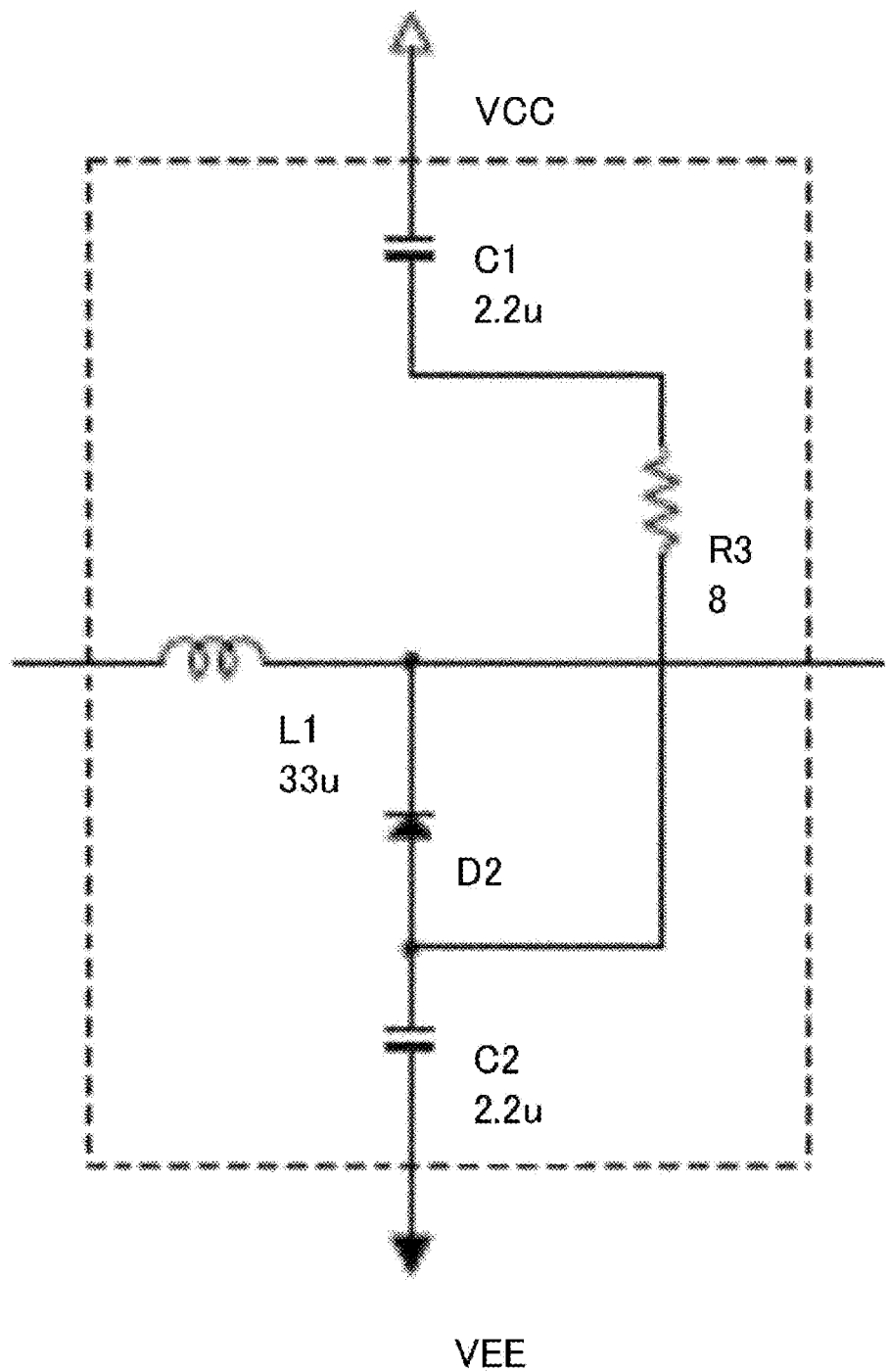
FIG. 10 illustrates an equivalent circuit in a case where a negative-side input signal is input to the third jumping-up circuit.

FIG. 10 illustrates an equivalent circuit of the jumping-up circuit 20B in a case where a negative-side input waveform is input to the jumping-up circuit 20B. In a configuration of FIG. 10, functional roles of the capacitor C1 and the capacitor C2 are switched when comparing with the configuration of FIG. 9, but the capacitors are operated according to the same principle as in the above description when a positive-side waveform is input.

Meanwhile, an electronic inductive load or an electronic capacitive load constituted by an electronic circuit and the like may be applied instead of the coil L and the capacitor C. As described above, according to the jumping-up circuits 20, 20A, and 20B of the amplifier 1 according to the embodiment, it is possible to obtain an output waveform causing overshooting and undershooting which exceed a power supply voltage in response to rising and falling of an input pulse using the jumping-up circuit. In addition, according to the jumping-up circuits 20A or 20B, it is possible to obtain an output waveform approximating to an output waveform of a vacuum tube amplifier by suppressing ringing. The configurations described in the embodiment can be appropriately combined within a range that does not deviate from the objective.

What is claimed is:

1. An amplifier comprising:
    a first power supply;
    a second power supply;
    an input terminal which receives a music signal;
    an amplifying circuit which amplifies the music signal using the power supply; and
    a circuit which is connected in series between an output end of the amplifying circuit and a speaker load, the circuit comprises:
        an inductor having one end connected to the output end of the amplifying circuit and another end connected to the speaker load;
        a first diode having an anode connected to the other end of the inductor;
        a second diode having a cathode connected to the other end of the inductor;
        a first capacitor having one end connected to a cathode of the first diode and another end connected to the first power supply;
        a second capacitor having one end connected to an anode of the second diode and another end connected to the second power supply; and
        a resistor having one end connected to the cathode of the first diode and another end connected to the anode of the second diode.

2. The amplifier according to claim 1, wherein
    an output waveform of the circuit generates a resonance wave having a plurality of peaks during rising and falling of a waveform with respect to an input waveform of the music signal due to the inductor, the first capacitor and the second capacitor of the circuit, wherein a peak value of a first peak of the resonance wave exceeds a first power supply voltage or a second power supply voltage.

3. A method of outputting a waveform of a music signal, the method comprising:
    amplifying the music signal by an amplifying circuit using a first power supply and a second power supply; and
    outputting a waveform exceeding a voltage value of the power supply by a circuit connected in series between an output end of the amplifying circuit and a speaker load, wherein the circuit comprises:
        an inductor having one end connected to the output end of the amplifying circuit and another end connected to the speaker load;
        a first diode having an anode connected to the other end of the inductor;
        a second diode having a cathode connected to the other end of the inductor;
        a first capacitor having one end connected to a cathode of the first diode and another end connected to the first power supply;
        a second capacitor having one end connected to an anode of the second diode and another end connected to the second power supply; and
        a resistor having one end connected to the cathode of the first diode and another end connected to the anode of the second diode.

4. The method of outputting a waveform of a music signal according to claim 3, wherein
    an output waveform of the circuit generates a resonance wave having a plurality of peaks during rising and falling of a waveform with respect to an input waveform of the music signal due to the inductor, the first capacitor and the second capacitor of the circuit, wherein a peak value of a first peak of the resonance wave exceeds a first power supply voltage or a second power supply voltage.

5. The method of outputting a waveform of a music signal according to claim 3, further comprising:
    charging the first capacitor and the second capacitor through a damping element.

* * * * *